(12) United States Patent
Meyer et al.

(10) Patent No.: US 11,493,576 B2
(45) Date of Patent: Nov. 8, 2022

(54) SELECTION OF MEASURING COILS IN MAGNETIC RESONANCE IMAGING

(71) Applicant: Siemens Healthcare GmbH, Erlangen (DE)

(72) Inventors: Stefan Meyer, Langensendelbach (DE); Manuela Rick, Uttenreuth (DE)

(73) Assignee: Siemens Healthcare GmbH, Erlangen (DE)

( * ) Notice: Subject to any disclaimer, the term of this patent is extended or adjusted under 35 U.S.C. 154(b) by 467 days.

(21) Appl. No.: 16/663,576

(22) Filed: Oct. 25, 2019

(65) Prior Publication Data

US 2020/0132790 A1 Apr. 30, 2020

(30) Foreign Application Priority Data

Oct. 25, 2018 (EP) .................................. 18202596

(51) Int. Cl.
 *G01R 33/36* (2006.01)
 *G01R 33/385* (2006.01)
 *G01R 33/3875* (2006.01)

(52) U.S. Cl.
 CPC .......... *G01R 33/36* (2013.01); *G01R 33/385* (2013.01); *G01R 33/3875* (2013.01)

(58) Field of Classification Search
 CPC .. G01R 33/36; G01R 33/385; G01R 33/3875; G01R 33/546; G01R 33/3664; G01R 33/20; G01R 33/34; A61B 5/055
 See application file for complete search history.

(56) References Cited

U.S. PATENT DOCUMENTS

| 8,525,517 B2 * | 9/2013 | Ichinose ............ G01R 33/3415 324/307 |
| 2011/0006766 A1 | 1/2011 | Jurrissen et al. |
| 2011/0103668 A1 * | 5/2011 | Uchizono ............ G01R 33/565 382/131 |
| 2014/0145717 A1 | 5/2014 | Ozawa et al. |
| 2015/0293196 A1 | 10/2015 | Marechal et al. |

FOREIGN PATENT DOCUMENTS

DE 102014207236 A1 10/2015

OTHER PUBLICATIONS

EP Search Report dated Jun. 4, 2019, for Application No. 18202596.5.

* cited by examiner

*Primary Examiner* — G. M. A Hyder
(74) *Attorney, Agent, or Firm* — Banner & Witcoff Ltd.

(57) ABSTRACT

The present disclosure relates to techniques for the selection of one or more measuring coils in magnetic resonance imaging. Herein, account can be taken of a preselection in the selection of the one or more measuring coils from a plurality of candidate coils.

20 Claims, 3 Drawing Sheets

SELECTION OF MEASURING COILS IN MAGNETIC RESONANCE IMAGING

CROSS-REFERENCE TO RELATED APPLICATIONS

The present application claims the benefit of the filing date of European patent application no. EP18202596.5, filed on Oct. 25, 2018, the contents of which are incorporated herein by reference in their entirety.

TECHNICAL FIELD

The present disclosure relates to techniques for selecting one or more measuring coils in magnetic resonance imaging.

BACKGROUND

Magnetic resonance (MR) imaging can be used to examine different anatomical regions of an examination subject. For this, nuclear spins in a region of interest can be deflected out of the rest position by the radiation of radio-frequency (RF) pulses. Subsequently, raw data can be acquired corresponding to RF signals of the relaxing nuclear spins. One or more MR images can be generated therefrom. Measuring coils are used for radiating and receiving RF signals.

SUMMARY

The operation of MR systems typically requires a large number of operating parameters to be set. For example, it is necessary to select one or more MR protocols that define the sequence of radiated RF pulses and periods for receiving RF signals and further parameters, such as, for example, gradient pulses. The selection of the suitable MR protocol is typically strongly correlated with the selection of the suitable measuring range or the selection of the appropriate measuring coil. If, for example, the "wrong" or redundant measuring coil is selected, the quality of the MR images may be impaired or it may be necessary to repeat the measurement.

In reference implementations, there is an automatic selection of all the measuring coils lying within the measuring range (also called the examination volume). This restricts the possible fields of application of automatic coil selection. For example, during a knee examination, the knee coil is positioned on the spine coil that is permanently installed in the table. However, automatic selection of both the coils would result in increased foldover artifacts, and therefore automatic selection of the knee coil only is desired. This frequently has the result that a plurality of MR protocols are filed in a protocol database, wherein the different MR protocols are then permanently associated with different measuring coils, i.e. automatic coil selection is not used.

As a result, the use of the wrong measuring coil is sometimes observed, so that the quality of the MR images is impaired or the measuring duration is greatly increased or has to be repeated. For example, it may be the case that new requirements for the selection of measuring coil arise in the measuring phase (i.e. during run-time immediately before or during the MR imaging when the patient is already located in the MR system) depending upon the positioning of the patient or the size of the patient. In reference implementations—i.e. in the case of MR protocols that are permanently associated with one or more measuring coils—this can be difficult or impossible to take into account. Therefore, this may result in a suboptimal selection of the measuring coil with restricted image quality. The same applies to a manual mode in which the user can activate or deactivate individual coils out of all the candidate coils available. In order to keep the workflow on the scanner simple, coil selection in manual mode is typically performed during a planning phase (i.e. before the measuring phase) so that no adaptation is necessary during the measuring phase—for example to the specific positioning or size of the patient. However, this does not then take into account any special features resulting from the use of another coil, another position, changes due to the patient physiognomy, etc. In addition, manual coil selection is time-consuming and error-prone, and thus limits the availability of an MR system.

Therefore, there is a need for improved techniques for the selection of at least one measuring coil from a plurality of candidate coils of an MR system in MR imaging, such as techniques that remedy at least some of the above-named disadvantages and limitations.

This object is achieved by the features of the embodiments described herein, including the independent claims. The features of the dependent claims further define additional improvements in accordance with various embodiments.

In one example, a method for the selection of at least one measuring coil from a plurality of candidate coils of an MR system in MR imaging comprises receiving first control data. The first control data indicates a measuring range. In addition, the method comprises receiving second control data indicating a preselection (e.g. an initial selection) from among the plurality of candidate coils. The method further comprises the selection of the at least one measuring coil from the plurality of candidate coils based on the measuring range and the initial, or preselection. The method further comprises triggering an MR protocol for MR imaging with the at least one measuring coil.

For example, it would be possible for the at least one measuring coil to comprise a receiver coil or even a combined transmitter/receiver coil. The plurality of candidate coils can be held in a coil database associated with the MR protocols. The candidate coils can refer to a group of possible measuring coils that are in principle suitable for use with the MR system.

Herein, there can be an assignment between the different candidate coils and the positioning on the patient. For example, different candidate coils can be configured to be positioned in relation to different measuring ranges. Some of the coils can, for example, be embedded in fixed components of the MR system, for example a table, etc. On the other hand, other coils can be attached in moving coil components, which can, for example be plugged-in or unplugged, or positioned differently on the patient. Herein, a coil component can also contain a plurality of coil elements.

For example, it would be possible for the first control data and/or the second control data to be received by a user interface of the MR system. For example, the user of the MR system could specify the measuring range when setting the different measuring parameters in a planning phase or even shortly before the measuring phase and/or specify the preselection from the plurality of candidate coils.

For example, the measuring range can specify an anatomical region or a spatial volume.

Generally, the preselection may be defined positively or negatively. This means that the preselection can, for example, exclude one or more candidate coils from the plurality of candidate coils so that these are not taken into account in the selection. In other words, this means that one or more non-selectable coils can be indicated in the context of the preselection. However, on the other hand, the preselection may implement a preference for the selection of the coils. For example, the preselection could define a subset of the plurality of candidate coils that can be selected in the context of the selection of the at least one measuring coil. For example, the second control data may comprise one or more selectable coil classes or coil compartments. This means that the coils that can be selected in the context of the selection of the at least one measuring coil do not necessarily have to be indicated explicitly by the second control data, but can instead be indicated by the second control data in a parameterized manner. In other words, this means that it is possible to define certain rules for the selection of the at least one measuring coil by means of the coil class(es) or coil compartments(s).

Herein, coil compartments typically designate one or more coil elements of a coil component comprising a plurality of coil elements. One example would be a coil component for imaging a region of interest corresponding to the head of an examination subject. Herein, different coil compartments can, for example, designate different positions on the head, for example the front or back.

For example, embodiments include the one or more selectable coil classes or coil compartments being defined in the context of an associated anatomical region. This means that the second control data can define that the preselection permits coils that enable imaging of the corresponding anatomical region or which can be positioned by a corresponding coil component close to the corresponding anatomical region.

In this way, in cases in which the measuring range is comparatively large to reduce artifacts, it is possible for a better selection of the at least one measuring coil to be made. For example, the measuring range can relate to a comparatively large anatomical region while the one or more selectable coil classes or coil compartments can be defined in respect of a corresponding smaller anatomical region that is included in the measuring range and is to be depicted.

The above describes techniques with which the selection of the at least one measuring coil is based on the measuring range and the preselection. Alternatively or additionally, embodiments may also take into account further decision-making criteria in the context of the selection of the at least one measuring coil. For example, the method may further comprise: receiving third control data indicating at least one coil connected to the MR system. Herein, the selection of the at least one measuring coil can further be based on the at least one coil connected to the MR system. In other words, this can mean that it is possible to check which of the plurality of candidate coils have actually been "plugged in", i.e. are electronically connected to the MR system.

The method can further comprise associating the MR protocol with the at least one measuring coil after at least one measuring coil has been selected. In other words, this can mean that it is not necessary for there to be a previous association of the MR protocol with the at least one measuring coil. For example, the MR protocol may be associated only with the at least one measuring coil in the measuring phase. This makes it possible to dispense with the need to hold a plurality of different MR protocols in a protocol database, wherein the different MR protocols are all permanently associated with measuring coils. Instead, it is possible to use one and the same MR protocol with different measuring coils depending upon the current situation as depicted in the measuring phase. For example, this enables a different position of the patient, etc., to be taken into account.

Therefore, embodiments include at least one measuring coil to be selected after a planning phase and before or during a measuring phase. In this context, therefore, it would be possible for the MR protocol to be loaded from a protocol database without any association with the at least one measuring coil.

In an embodiment, an MR system comprises a computing unit. The computing unit is configured for the selection of at least one measuring coil from a plurality of candidate coils of the MR system in MR imaging. Herein, the computing unit is configured to receive first control data indicating a measuring range. In addition, the computing unit is configured to receive second control data indicating a preselection from the plurality of candidate coils. The computing unit is further configured, based on the measuring range and the preselection, to select at least one measuring coil from the plurality of candidate coils. In addition, the computing unit is configured to trigger an MR protocol for MR imaging with the at least one measuring coil.

In an embodiment, a computer program or a computer program product or an electronically readable storage medium (e.g., a non-transitory computer-readable medium) comprises program code that can be loaded and executed by at least one processor. The execution of the program code causes the at least one processor to execute the following steps: receiving first control data indicating a measuring range of MR imaging by means of an MR system; receiving second control data indicating a preselection from a plurality of candidate coils of the MR system; selecting at least one measuring coil from a plurality of candidate coils based on the measuring range and the preselection; and triggering an MR protocol for the MR imaging with the at least one measuring coil.

The above-described features and features described below can be used not only in the corresponding combinations that are explicitly set out but also in further combinations or in isolation without departing from the scope of protection of the present disclosure.

BRIEF DESCRIPTION OF THE DRAWINGS/FIGURES

The accompanying drawings, which are incorporated herein and form a part of the specification, illustrate the embodiments of the present disclosure and, together with the description, further serve to explain the principles of the embodiments and to enable a person skilled in the pertinent art to make and use the embodiments.

The present disclosure is described in detail below using embodiments according to the disclosure with reference to the figures. The exemplary embodiments of the present disclosure will be described with reference to the accompanying drawings. The drawing in which an element first appears is typically indicated by the leftmost digit(s) in the corresponding reference number.

DETAILED DESCRIPTION

Figure 1:
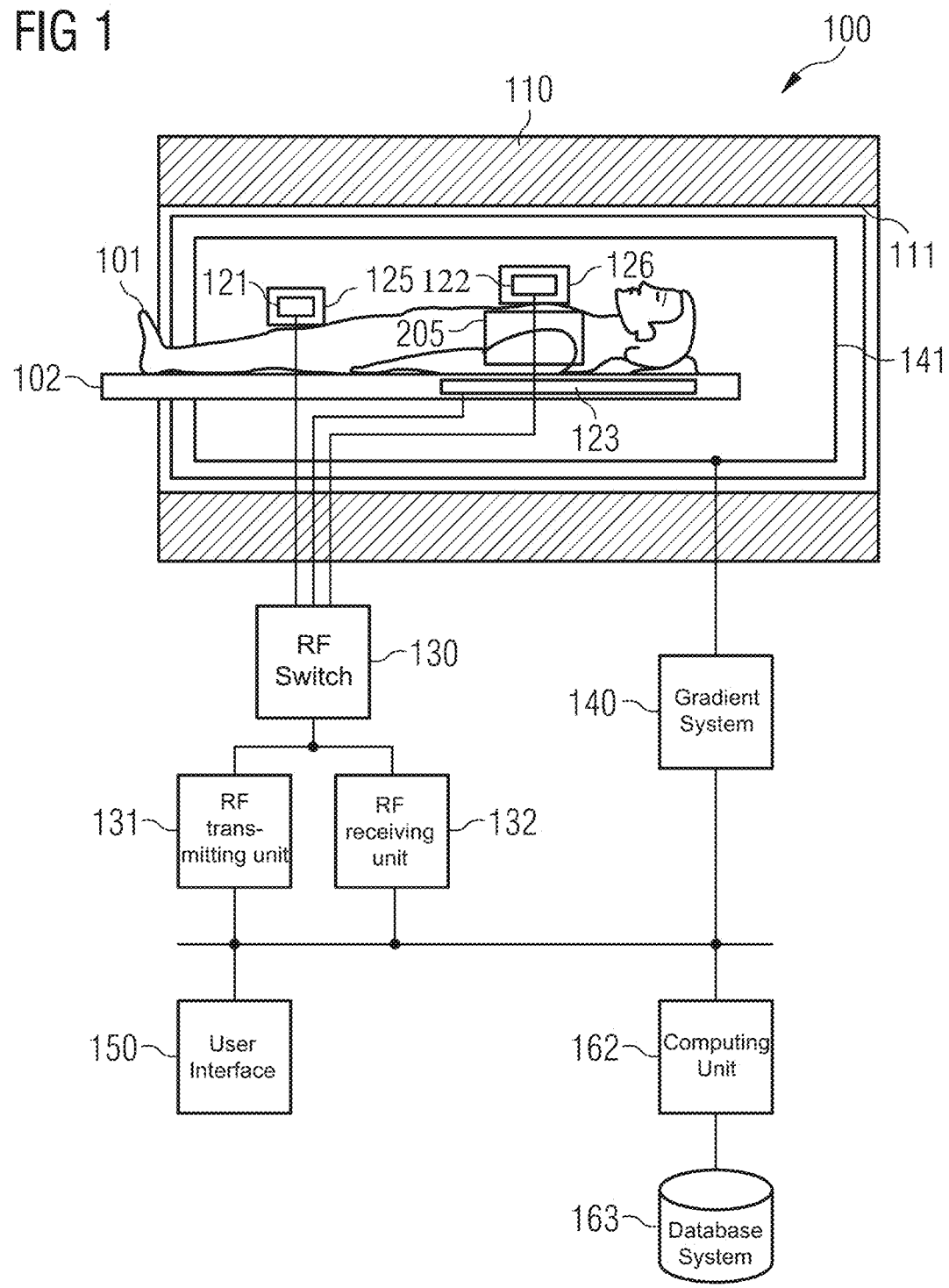
FIG. 1 is a schematic illustration of an example MR system for MR imaging, in accordance with an embodiment of the present disclosure.

The above-described properties, features and advantages of this disclosure and manner in which these are achieved will become clearer and more plainly comprehensible in conjunction with the following description of the exemplary embodiments explained in more detail in the context of the drawings.

The following describes the present disclosure with reference to various embodiments and with reference to the drawings. In the figures, the same reference characters refer to the same or similar elements. The figures are schematic representations of different embodiments of the disclosure. Elements depicted in the figures are not necessarily shown true to scale. Rather, the different elements depicted in the figures are reproduced in such a way that their function and general purpose become comprehensible to the person skilled in the art. Connections and couplings between functional units and elements that are depicted in the figures may also be implemented as an indirect connection or any suitable type of coupling. For instance, a connection or coupling may be implemented in a wired or wireless manner Functional units may be implemented as hardware, software, or a combination of hardware and software.

The following describes techniques for MR imaging. In particular, techniques for setting parameters in the context of MR imaging are described. The techniques described herein can generally be performed in a planning phase and/or in or before a measuring phase. Therefore, it would, for example, be possible for the techniques described herein to be performed in the planning phase—before an examination subject has been positioned in the MR system.

Different techniques described herein enable partially automated selection of one or more measuring coils for MR imaging from a pool of available candidate coils. For example, the candidate coils could indicate all coils registered in principle with an MR system.

With partially-automated selection of one or more measuring coils, the embodiments described herein include taking into account further parameters in addition to the measuring range and the coils that are actually plugged in, for instance. For example, in different examples all the coils within the measuring range may be selected, but with the exception of one or more non-selectable coils. One example of non-selectable coils could, for example, be the so-called "spine coil" integrated in the longitudinal direction in a table of the MR system. A functionality of this kind can in particular be of interest for orthopedic questions for which a dedicated joint coil is used, for example knee examinations with a knee coil component, shoulder examinations with a shoulder coil component, hand examinations with a hand/wrist coil component, ankle examinations with a foot/ankle coil component, etc. In addition, an implementation of this kind can be desirable for breast examinations in which the spine coil remains on the examination table and a breast coil component is placed on top. Here, if the spine coil is selected in addition to one or more coils of the breast coil component, the image quality of the MR images can be reduced due to foldover artifacts. This is avoided by defining the spine coil as a non-selectable coil as described herein.

It is evident from the above example that one or more non-selectable coils can be excluded as a preselection from the plurality of candidate coils.

In a further example, it would be possible for the user to make a preselection of all the possible candidate coils in a positive manner. For example, the user could select coil classes—and possibly, with certain coil classes with which further subdivision is possible, also so-called coil compartments—from a corresponding selection list in order to define selectable coils in the context of the preselection. The following describes an example in order to illustrate a corresponding application assuming that a user plans a unilateral examination of the right breast with transverse imaging. A conventional mechanism for the selection of coils in accordance with reference implementations would select both compartments of a breast coil component, i.e. one or more left coils and one or more right coils. The use of the left and right coils of the breast coil component would result in foldover artifacts and in reduced image quality. Therefore, it would, for example, be possible for the corresponding preselection to indicate the right coil compartment of the breast coil component. Depending upon the breast coil component specifically used, it is then possible for one or more right-hand-side coils of the breast coil component to be selected.

Taking into account a preselection of this kind when selecting one or more measuring coils from the plurality of candidate coils makes it possible to dispense with the need for there to be a permanent association with one or more coils in the different MR protocols. This means that the MR protocols can be loaded from a protocol database without any association with a measuring coil. Instead, the embodiments described herein facilitate a suitable measuring coil or suitable MR coils to be determined during run-time (e.g. only during run-time) and correspondingly linked with the selected MR protocol. This means that the selection of one or more measuring coils can take place during run-time, i.e. in the context of the measuring phase. This enables the MR protocols to be filed offline in a protocol database without coil information and optimized coil information thus only needs to be added to the respective MR protocols dynamically during run-time. This resolves various disadvantages in reference implementations—for example, parameters of MR imaging, etc., which are only foreseeable in the context of the measuring phase. In addition, it is possible to ensure better transferability of different MR protocols since the different MR protocols no longer have to be converted on account of coils. Hence, it is also possible for identical MR protocols to be used on different MR systems.

In protocol development, the processing time can be reduced by the improved performance in opening, processing, and storing MR protocols. Conversions on account of changed coil information are no longer necessary. The MR protocols are interchangeable in the case of MR systems with the same field strength, a similar number of receive channels, and the same gradient systems. This could mean, for example, that the number of preconfigured MR protocols in a protocol database can be significantly reduced. Optimal selection of measuring coils during run-time can minimize the need for preselection of the measuring coils and improve image quality. Manual intervention in the selection of the measuring coils on the part of the user and repetition of MR protocols because of restricted imaging due to incorrectly selected measuring coils will be required less frequently. In the context of protocol development, identical MR protocols can be used for different MR systems, thus significantly reducing development time. The system can also determine the coils in a (partially) automated manner in all clinically relevant cases. Increasing efficiency in protocol development and a drastic reduction in the number of MR protocols required in a protocol database can enable future support for all planned configurations of MR systems. Improved automated selection of measuring coils can improve the image quality and enable fewer manual interventions on the part of the user. Moreover, the embodiments described herein allow for the transfer of MR protocols between different MR systems in a simpler, faster, and less error-susceptible manner.

FIG. 1 is a schematic illustration of an example MR system for MR imaging, in accordance with an embodiment of the present disclosure. FIG. 1 illustrates the embodiments described herein in the context of an example MR system 100. The MR system 100 is configured for MR imaging. The MR system 100 comprises a magnet 110 that defines a tube 111. The magnet 110 can generate a basic magnetic field parallel to its longitudinal axis. An examination object, here an examination subject 101, is positioned on a table 102. The table 102 can be pushed into the magnet 110. The MR system 100 further comprises a gradient system 140 for generating gradient fields, which are used for MR imaging and for spatial encoding of acquired raw data. For this, typically at least three separately-controllable gradient coils 141 are provided. The gradient coils 141 enable gradient fields to be applied and switched along specific spatial directions (gradient axes). The gradient fields can, for example, be used for slice selection, frequency encoding (in the readout direction), and for phase encoding. This can achieve spatial encoding of the raw data.

Transmitting coils (not shown in FIG. 1) are used to excite the polarization or alignment of the nuclear spins or the magnetization produced in the basic magnetic field in the longitudinal direction. The transmitting coils enable the radiation of an amplitude-modulated RF excitation pulse into a measuring range 205. This enables the generation of transverse magnetization.

Receiving coils 121-123 are used to receive RF signals of the relaxing transverse magnetization. Herein, the receiving coils 121-123 can optionally be connected to an RF switch 130 in coil components 125-126. For instance, the example in FIG. 1 depicts a breast coil component 126 with a breast coil 122 and a knee coil component 125 with a knee coil 121. A breast examination can also be performed in prone position. Some coils can also be permanently installed in the MR system 100, for example, in the scenario in FIG. 1, a spine coil 123 extending along of the table 102 in the head-foot direction of the examination subject 101. Depending upon the objective of the MR imaging, different ones of these receiving coils 121-123 can be connected to the MR system 100. Herein, corresponding control data can be transmitted to a computing unit 162, wherein the control data indicates which receiver coils 121-123 are connected to the RF switch 130, i.e. are "plugged-in". In various embodiments, the computing unit 162 may be implemented as any suitable type of computing component. For instance, the computing unit 162 may be implemented as a control computer used to control the MR system 100. As additional examples, the computing unit 162 may be implemented with one or more hardware processors, processing circuitry, etc., which may work independently or in conjunction with software components to facilitate the embodiments as described herein.

As a general rule, the receiving coils 121-123 or at least individual receiving coils 121-123 could also be used as transmitting coils. Therefore, the RF switch 130 can be embodied in order to connect the coils 121-123 optionally to an RF transmitting unit 131 or an RF receiving unit 132. The RF transmitting unit 131 can comprise an RF generator in an RF amplitude-modulation unit. The RF receiving unit 132 can be used to acquire RF signals of relaxing transverse magnetization by inductive coupling into the corresponding receiving coils 121-123.

While the example in FIG. 1 depicts a scenario in which the coil components 125-126 each comprise a single coil 121-122, in other examples it would also be possible for coil components to define a plurality of coil compartments in which in each case one or more coil elements are arranged.

In addition, in different examples, it would be possible for the coils to be embodied as array coil elements, which can in particular be helpful in the context of image-accelerated MR imaging.

The MR system 100 further comprises a user interface 150, which can, for example, comprise a screen, a keyboard, a mouse etc. The user interface 150 can be used to acquire user input and provide output to the user. For example, it could be possible for the user interface 150 to be used to set individual operating modes or operating parameters of the MR system—by the user and/or automatically and/or remotely. For example, the user interface 150 may be used to establish the measuring range 205 or to make a preselection in the context of the selection of one or more receiving coils 121-123.

In the example in FIG. 1, the computing unit 162 is furthermore connected to a database system 163, which can, for example, implement a protocol database and/or a coil database. Herein, the coil database could indicate a plurality of candidate coils that are compatible with the MR system 100. For example, the database system 163 could be implemented in a cloud-based solution.

Figure 2:
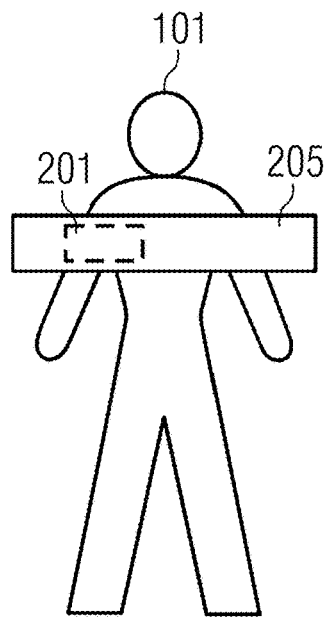
FIG. 2 is a schematic illustration of an example measuring range and a preselection of coils for MR imaging, in accordance with an embodiment of the present disclosure.

FIG. 2 is a schematic illustration of an example measuring range and a preselection of coils for MR imaging, in accordance with an embodiment of the present disclosure. FIG. 2 further illustrates aspects in an example context of the measuring range 205 and a preselection 201 relating to the plurality of candidate coils. Typically, there can be a large number of possible candidate coils that are compatible with the MR system 100. For example, it is possible for a plurality of different coils to be plugged in depending upon the anatomical region defined by the measuring range 205. In addition, it can also be possible to select different coils 121-123 in the context of the measuring range 205: for example, in the scenario shown in FIG. 1, an RF signal could be measured by means of the spine coil 123 and also by means of the breast coil 122.

Therefore, it is sometimes desirable to make the preselection 201 in the context of the plurality of candidate coils (for example, all stretched coils 121-123, as shown in FIG. 1). It is then possible for at least one measuring coil to be selected from the plurality of candidate coils based on the measuring range 205, and this preselection 201. In the example shown in FIG. 2, the preselection relates to a coil compartment of the breast coil component 126. For instance, the preselection 201 relates to the left coil compartment of the coil component 126. The left coil compartment contains one or more coil elements 122 of the breast coil component 126. Generally, it would be possible for the preselection 201 to define one or more selectable coil classes or coil compartments. For example, the one or more coil classes or coil compartments could be defined in the context of an associated anatomical region (in the example in FIG. 2, the left breast).

In further examples, however, the preselection could, for example, also define one or more non-selectable coils. Continuing the context of the scenario in FIG. 1, the one or more non-selectable coils could, for example, relate to the spine coil 123.

In the example shown in FIG. 2, it is evident that the anatomical region ("left breast") defined by the preselection 201 is smaller than the anatomical region defined by the measuring range 205 ("breast region"). This enables the suitable coil of the breast coil component 126 to be selected.

Figure 3:
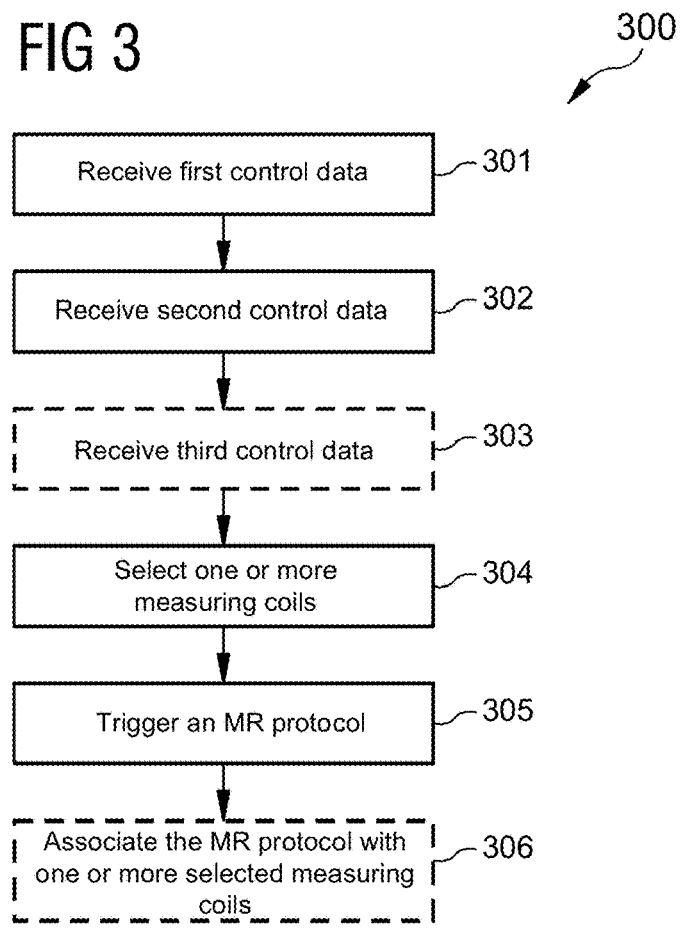
FIG. 3 is a flow diagram of an example method, in accordance with an embodiment of the present disclosure.

FIG. 3 is a flow diagram of an example method, in accordance with an embodiment of the present disclosure. The method 300 as depicted in FIG. 3 may be implemented in accordance with any suitable computing system and/or user intervention. For example, embodiments include the method 300 being executed via the computing unit 162 by loading corresponding program code from a memory (e.g., non-transitory computer-readable media), and then reading the loaded program code to execute one or more computer-readable instructions and carry out the method 300.

The method 300 may include receiving (block 301) first control data indicating a measuring range. The measuring range can, for example, be defined in the context of an anatomical region.

The method 300 may include receiving (block 302) second control data indicating a preselection from a plurality of candidate coils.

In various embodiments, the first and second control data may be received via a user interface by user input (e.g. user interface 150). For clarity, the method 300 is further discussed in conjunction with the user interface as shown and described in FIG. 4.

Figure 4:
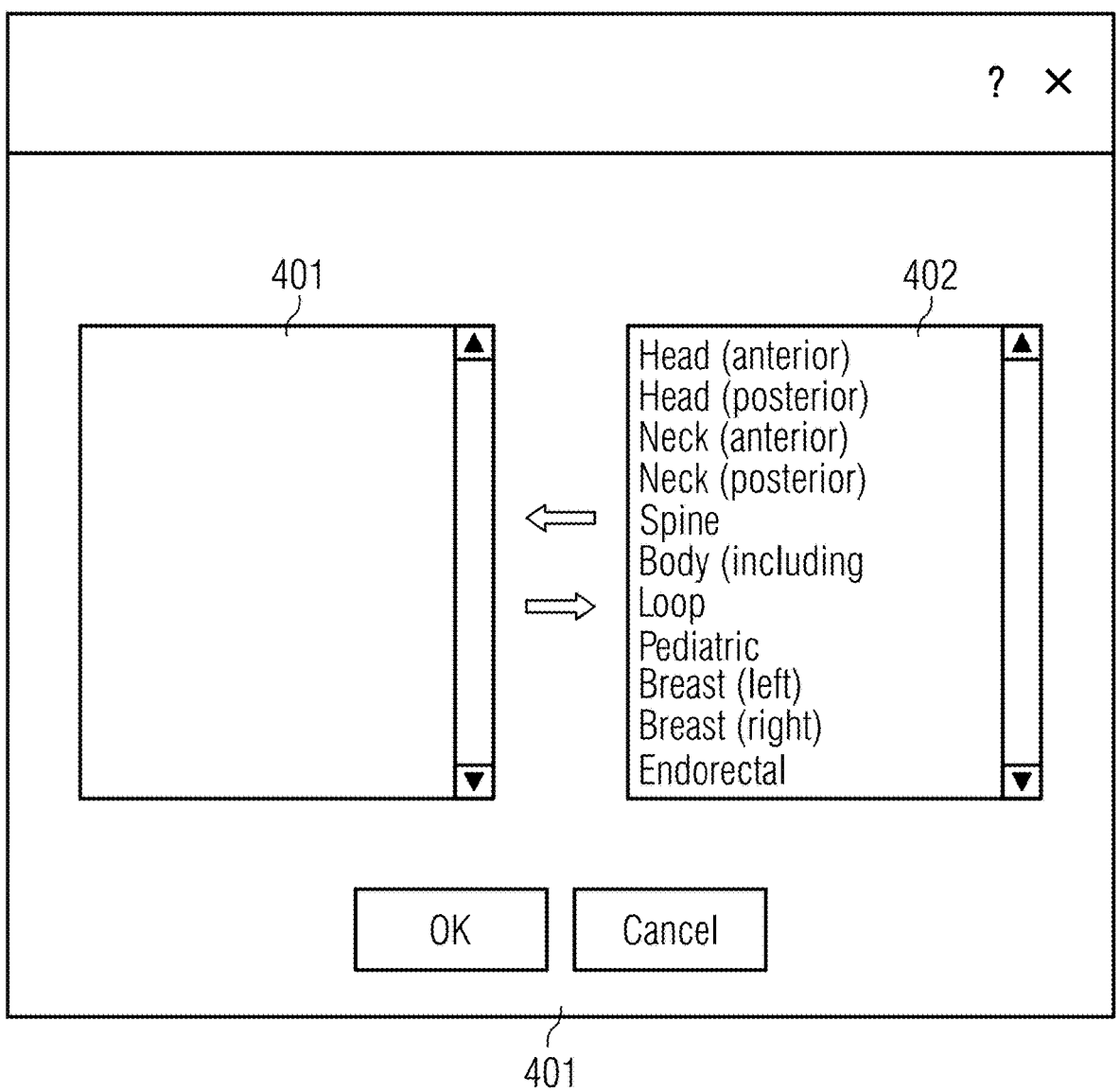
FIG. 4 is a schematic illustration of an example user interface for making a preselection of coils, in accordance with an embodiment of the present disclosure.

FIG. 4 is a schematic illustration of an example user interface for making a preselection of coils, in accordance with an embodiment of the present disclosure. FIG. 4 shows an example of the implementation of a user interface for establishing a preselection from a plurality of candidate coils (block 302). FIG. 4 depicts a menu dialog 401, which could, for example, be executed in a control program, which can be reproduced on a screen. Herein, there are two selection fields 401, 402. The selection field 402 holds a list of all definable coil classes and coil compartments. The user can then transfer individual or several of these coil classes and coil compartments into the selection field 401, thus enabling the corresponding preselection of selectable coils—parameterized by means of the coil classes and coil compartments—to be established.

With continued reference to FIG. 3, method 300 may optionally include receiving (block 303) third control data indicating at least one coil connected to the MR system. This means that the third control data can, for example, indicate coils that are connected electronically to a corresponding RF switch of the MR system by the establishment of a corresponding plug-in connection.

Method 300 may include selecting (block 304) one or more measuring coils. This could, for example, take place before and during the measuring phase.

Herein, the selection (block 304) of the one or more measuring coils may be based on the received control data (e.g., the first, second, and optional third control data received in blocks 301, 302, and 303, respectively). In other words, this means that the one or more measuring coils can be selected based on the measuring range, the preselection, and/or the activated coils. For example, during the selection, it is possible for coils indicated as non-selectable coils by the second control data to be ignored. It is also possible for coils to be ignored that were not indicated as selectable coils by the second control data in block 302.

Method 300 may include triggering or executing (block 305) an MR protocol. This may include, for instance, the MR protocol being be loaded from a protocol database (e.g., computing unit 162 loading the MR protocol from the database system 163).

For example, a corresponding control command could be sent to a protocol control unit so that then the MR imaging takes place by means of the MR protocol and using the selected one or more measuring coils.

The MR protocol could be loaded from the protocol database without any association. Thus, the method 300 may optionally include associating (block 306) the MR protocol with the one or more selected measuring coils (block 304). This means that, for example, the MR protocol could be filed with a cross reference in a protocol database.

To summarize, the above embodiments describe techniques with which a partially automated or fully automated selection of one or more measuring coils can be performed. For example, one or more receiving coils can be selected as measuring coils. The above-described embodiments remedy various problems with traditional implementations. For example, it is possible to file MR protocols in a protocol database without establishing a fixed cross-reference or association to one or more measuring coils. This enables MR protocols to be converted between different MR systems in a particularly simple manner because the MR protocols are not linked to coils that may possibly be specific to an MR system.

In addition, an optimal selection of measuring coils may be achieved. For instance, coils, which could possibly result in impaired image quality due to foldover artifacts (typically for example a spine coil) could be excluded as non-selectable coils in the context of the preselection. This can, for example, occur in the context of the measuring phase so that there is no need to select one or more measuring coils in the planning phase without specific knowledge of the patient data (for example, size of the patient and position of the patient). Consequently, there is no need for a subsequent adaptation of the MR protocols. An adaptation may, for example, only need to be performed in the event that the imaging does not show the desired results or the coil selection fails. Conversion on the transfer of MR protocols between different MR systems configured to use different coils can take place more easily. For example, conversion of the MR protocols can be dispensed with because there is no need for the preliminary association of the MR protocols with individual coils.

The features of the above-described embodiments and aspects of the disclosure can be combined with one another. For instance, the features can be used not only in the described combinations, but also in other combinations or in isolation without departing from the field of the disclosure.

For example, the above description relates to techniques with which one or more receiving coils can be indicated as measuring coils in the context of a preselection. Corresponding techniques can also be implemented to make a preselection with respect to one or more transmitting coils.

Although the embodiments of the present disclosure have been illustrated and described in detail using the preferred exemplary embodiment, the disclosure is not limited by the disclosed examples, and a person skilled in the art can derive other variations therefrom without departing from the scope of protection of the disclosure.

What is claimed is:

1. A method for selecting at least one measuring coil from a plurality of candidate coils of a magnetic resonance system used for magnetic resonance imaging, the method comprising:

receiving first control data indicating a measuring range;

receiving second control data indicating (i) an initial coil selection from among the plurality of candidate coils comprising one or selectable coils that are within the measuring range, and (ii) one or more non-selectable coils from among the plurality of candidate coils that are within the measuring range but are to be excluded from the initial coil selection;

based on the measuring range and the initial coil selection, selecting at least one measuring coil from the plurality of candidate coils; and executing a magnetic resonance protocol to perform magnetic resonance imaging using the selected at least one measuring coil.

2. The method as claimed in claim 1, wherein the one or more non-selectable coils comprise a spine coil.

3. The method as claimed in claim 1, wherein the second control data comprises one or more selectable coil classes or coil compartments.

4. The method as claimed in claim 3, wherein the one or more selectable coil classes or coil compartments are defined with respect to a first anatomical region.

5. The method as claimed in claim 4, wherein the measuring range is defined with respect to a second anatomical region that is larger than the first anatomical region.

6. The method as claimed in claim 1, further comprising:
receiving third control data indicating at least one coil connected to the magnetic resonance system,
wherein the selection of the at least one measuring coil from the plurality of candidate coils is further based on the at least one coil connected to the magnetic resonance system.

7. The method as claimed in claim 1, further comprising:
associating the magnetic resonance protocol with the at least one selected measuring coil after selecting the at least one measuring coil from the plurality of candidate coils.

8. The method as claimed in claim 1, wherein the act of selecting the at least one measuring coil from the plurality of candidate coils is performed (i) after a planning phase, and (ii) before or during a measuring phase associated with the magnetic resonance system.

9. The method as claimed in claim 1, further comprising:
loading the magnetic resonance protocol from a protocol database without associating the magnetic resonance protocol with the at least one selected measuring coil.

10. The method of claim 9, wherein the magnetic resonance protocol is stored in the protocol database without an association to a corresponding measuring coil, and
wherein the magnetic resonance protocol is associated with the selected at least one measuring coil only upon executing the magnetic resonance protocol to perform the magnetic resonance imaging using the selected at least one measuring coil.

11. A magnetic resonance system, comprising:
a user interface configured to enable an initial coil selection from among a plurality of candidate coils; and
a control computer configured to select at least one measuring coil from among the plurality of candidate coils of the magnetic resonance system used for magnetic resonance imaging by:
receiving first control data indicating a measuring range;
receiving second control data indicating (i) the initial coil selection from among the plurality of candidate coils via the user interface comprising one or selectable coils that are within the measuring range, and (ii) one or more non-selectable coils from among the plurality of candidate coils that are within the measuring range but are to be excluded from the initial coil selection;

based on the measuring range and the initial coil selection, selecting at least one measuring coil from the plurality of candidate coils; and executing a magnetic resonance protocol to perform magnetic resonance imaging using the selected at least one measuring coil.

12. The magnetic resonance system as claimed in claim 11, wherein the one or more non-selectable coils comprise a spine coil.

13. The magnetic resonance system as claimed in claim 11, wherein the second control data comprises one or more selectable coil classes or coil compartments.

14. The magnetic resonance system as claimed in claim 13, wherein the one or more selectable coil classes or coil compartments are defined with respect to a first anatomical region.

15. The magnetic resonance system as claimed in claim 14, wherein the measuring range is defined with respect to a second anatomical region that is larger than the first anatomical region.

16. The magnetic resonance system as claimed in claim 11, wherein the control computer is further configured to receive third control data indicating at least one coil connected to the magnetic resonance system, and to select the at least one measuring coil from the plurality of candidate coils further based on the at least one coil connected to the magnetic resonance system.

17. The magnetic resonance system as claimed in claim 11, wherein the control computer is further configured to associate the magnetic resonance protocol with the at least one selected measuring coil after selecting the at least one measuring coil from the plurality of candidate coils.

18. The magnetic resonance system as claimed in claim 11, wherein the control computer is further configured to select the at least one measuring coil from the plurality of candidate coils (i) after a planning phase, and (ii) before or during a measuring phase associated with the magnetic resonance system.

19. The magnetic resonance system as claimed in claim 11, wherein the control computer is further configured to load the magnetic resonance protocol from a protocol database without associating the magnetic resonance protocol with the at least one selected measuring coil.

20. The magnetic resonance system as claimed in claim 19, wherein the magnetic resonance protocol is stored in the protocol database without an association to a corresponding measuring coil, and
wherein the control computer is further configured to associate the magnetic resonance protocol with the selected at least one measuring coil only upon executing the magnetic resonance protocol to perform the magnetic resonance imaging using the selected at least one measuring coil.

* * * * *